United States Patent
Ho et al.

(10) Patent No.: US 7,580,292 B2
(45) Date of Patent: Aug. 25, 2009

(54) METHOD FOR PROGRAMMING A MULTILEVEL MEMORY

(75) Inventors: Hsin-Yi Ho, Hsinchu (TW); Nian-Kai Zous, Taoyuan (TW); I-Jen Huang, Kaohsiung (TW); Yung-Feng Lin, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 96 days.

(21) Appl. No.: 11/812,033

(22) Filed: Jun. 14, 2007

(65) Prior Publication Data
US 2008/0310223 A1    Dec. 18, 2008

(51) Int. Cl.
*G11C 16/04* (2006.01)
(52) U.S. Cl. .............. 365/185.24; 365/185.03; 365/185.28
(58) Field of Classification Search ........... 365/185.03, 365/185.24, 185.28
See application file for complete search history.

(56) References Cited

U.S. PATENT DOCUMENTS

| | | | |
|---|---|---|---|
| 7,382,660 B2* | 6/2008 | Bovino et al. | 365/185.28 |
| 7,388,779 B2* | 6/2008 | Nazarian | 365/185.03 |
| 7,397,705 B1* | 7/2008 | Huang et al. | 365/185.28 |
| 7,447,067 B2* | 11/2008 | Kong et al. | 365/185.03 |
| 7,447,068 B2* | 11/2008 | Tsai et al. | 365/185.03 |
| 7,468,912 B2* | 12/2008 | Ho et al. | 365/185.18 |
| 7,471,568 B2* | 12/2008 | Wu | 365/185.24 |
| 7,489,549 B2* | 2/2009 | Mokhlesi | 365/185.18 |

* cited by examiner

*Primary Examiner*—Tuan T Nguyen
*Assistant Examiner*—Hien N Nguyen
(74) *Attorney, Agent, or Firm*—Birch, Stewart, Kolasch & Birch, LLP

(57) ABSTRACT

A method for programming a MLC memory is provided. The MLC memory has a number of bits, and each bit has a number of programmed states. Each programmed state has a first PV level. The method includes (a) programming the bits of the memory having a Vt level lower than the PV level of a targeted programmed state into programmed bits by using a Vd bias BL; (b) ending this method if each bit of the memory has a Vt level not lower than the PV level of the targeted programmed state, otherwise, continuing the step (c); and (c) setting BL=BL+K1 and repeating the step (a) if each of the programmed bits has a Vt level lower than the PV level, while setting BL=BL−K2, and repeating the step (a) if at least one of the programmed bits has a Vt level not lower than the PV level.

18 Claims, 3 Drawing Sheets

First program operation ↓

Second program operation ↓

METHOD FOR PROGRAMMING A MULTILEVEL MEMORY

BACKGROUND OF THE INVENTION

1. Field of the Invention

The invention relates in general to a method for programming a multi-level cell (MLC) memory, and more particularly to a method for programming a MLC memory which can have a better tightened program distribution in a read operation.

2. Description of the Related Art

FIGS. 1A~1D are respectively schematic diagrams of threshold voltage (Vt) distributions of the programmed bits for a targeted programmed state in a conventional programming process of a MLC memory. As shown in FIG. 1A, the memory has an erase-state Vt distribution at first and each bit of the memory is to be programmed to a targeted programmed state. The Vt distribution of the targeted programmed state has a program verify (PV) level (a lower boundary). In order to have tightened Vt distribution of the programmed bits, a pre-PV level for the targeted programmed state is set to be lower than the PV level and two steps of program operations are performed as below.

In the first rough program operation, after a number of program shots, the bits of the memory are programmed to have a Vt distribution A as shown in FIG. 1B, some of which have a Vt level not lower than the pre-PV level of the targeted programmed state as shown by a dotted-line region in FIG. 1B. At the time, the memory records the bits passing (with a Vt level not lower than) the pre-PV level. Then, the bits with a Vt level lower than the pre-PV level in the Vt distribution A are further programmed to pass the pre-PV level to generate a new Vt distribution B as shown in FIG. 1C.

All the bits of the Vt distribution B pass the pre-PV level, and the memory records the bits passing the PV level first as shown by a dotted-line region in FIG. 1C. Following that, in the second fine program operation, the bits with a Vt level lower than the PV level in the Vt distribution B are further programmed to pass the PV level to generate the targeted program distribution C as shown in FIG. 1D and complete the whole programming process.

However, as shown in FIG. 1C, after the first program operation, some faster bits with a Vt level lower than and close to the PV level (denoted by a dotted-line region F) will be programmed again in the second program operation, which results in a widened Vt distribution for the targeted programmed state and in turn increases a bit error rate.

SUMMARY OF THE INVENTION

The invention is directed to a method for programming a MLC memory. Each time when at least one of the programmed bits passes the PV level of a targeted programmed state, the Vd bias is reduced by a fixed amount and when none of the programmed bits passes the PV level of a targeted programmed state, the Vd bias is increased by a fixed amount before the next program operation. By determining if at least one new bit passes the PV level, the program distribution can be tightened and the programming speed can be increased.

According to the present invention, a method for programming a MLC memory. The MLC memory has a number of bits, and each bit has a number of programmed states. Each programmed state has a PV level. The method comprises (a) programming the bits of the memory having a threshold voltage (Vt) level lower than the PV level of a targeted programmed state into programmed bits by using a Vd bias BL, and BL is larger than 0; (b) ending this method if each bit of the memory has a Vt level not lower than the PV level of the targeted programmed state, otherwise, continuing the step (c); and (c) setting BL=BL+K1, K1 being a fixed positive amount, and repeating the step (a) if each of the programmed bits has a Vt level lower than the PV level, while setting BL=BL−K2, K2 being a fixed positive amount, and repeating the step (a) if at least one of the programmed bits has a Vt level not lower than the PV level.

The invention will become apparent from the following detailed description of the preferred but non-limiting embodiments. The following description is made with reference to the accompanying drawings.

DETAILED DESCRIPTION OF THE INVENTION

The invention provides a method for programming a MLC memory. The bits of the memory not passing the PV level of the targeted programmed state are programmed by using a Vd bias. If at least one of the programmed bits passes the PV level, the Vd bias is reduced by a fixed amount while if none of the programmed bits passes the PV level, the Vd bias is increased by a fixed amount. Then the bits not passing the PV level are programmed again by using the new Vd bias. Therefore, the programming speed can be increased and the program distribution can be further tightened to reduce the bit error rate of the memory.

Figure 1A:
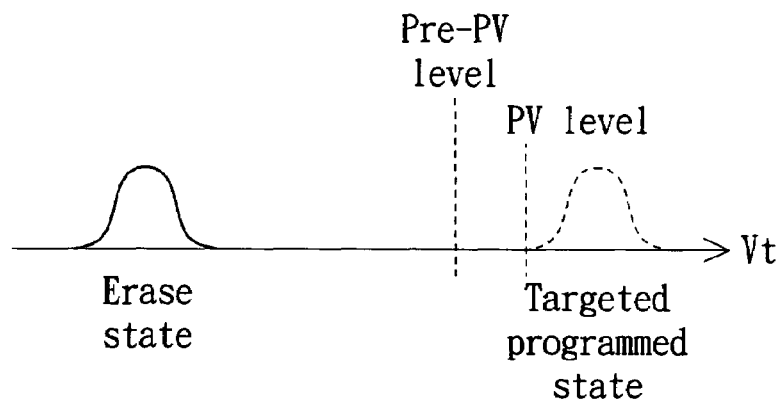
FIGS. 1A~1D are respectively schematic diagrams of Vt distributions of the programmed bits for a targeted programmed state in a conventional programming process of a MLC memory.
Figure 1B:
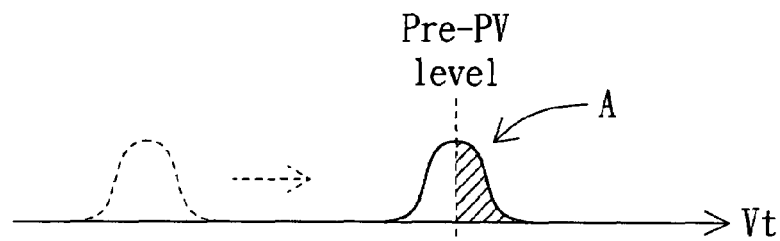
Figure 1C:
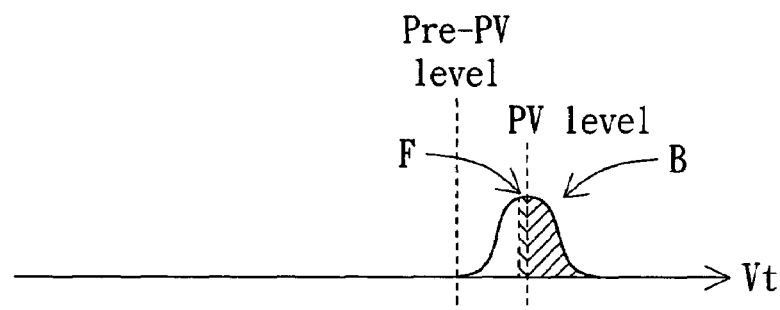
Figure 1D:
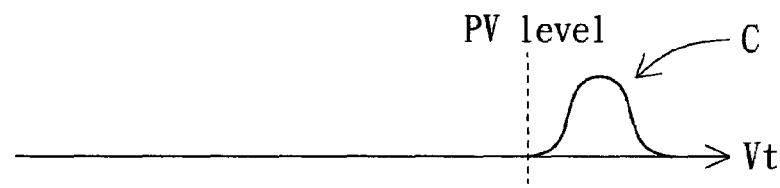
Figure 2:
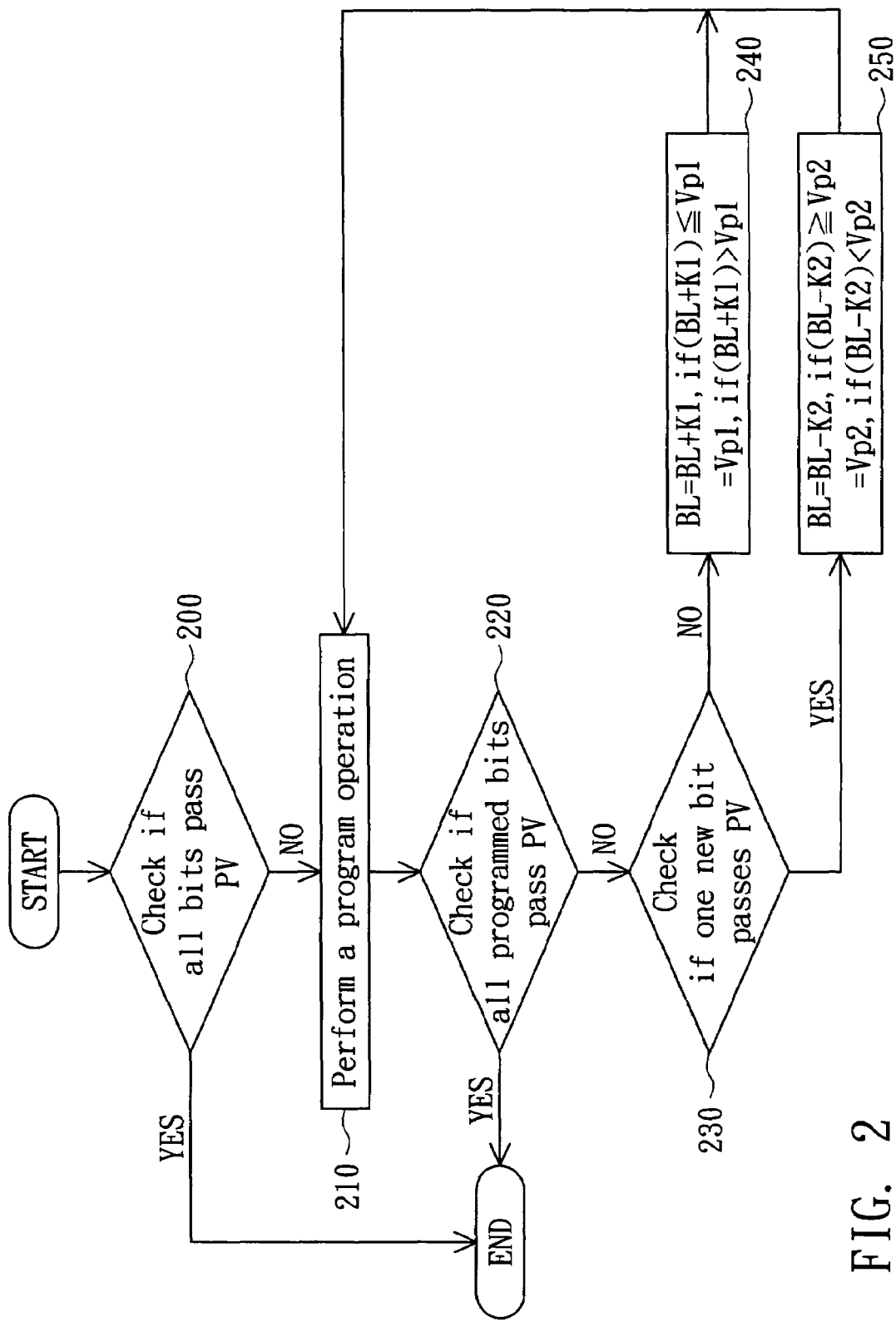
FIG. 2 is a flow chart of a method for programming a MLC memory according to a preferred embodiment of the invention.

Referring to FIG. 2, a flow chart of a method for programming a MLC memory according to a preferred embodiment of the invention is shown. For example, the MLC memory is a flash memory which is a charge localized trapped memory with oxide-nitride-oxide (ONO) structure.

The MLC memory includes a lot of cells, such as 1024× 256 cells, and each cell has a number of bits, such as two bits in the ONO structure. Each bit has a number of programmed states, such as 11, 10, 00 and 01. Each programmed state has a PV level. For example, the PV level of the programmed state 01 is 5.1V, and the PV level of the programmed state 00 is 4.3V, the PV level of the programmed state 10 is 3.5V. The following steps illustrate a process for programming the bits of the memory to a targeted programmed state, such as 01, 00 or 10.

First, in step 200, check if every bit of the memory passes the PV level, that is, has a Vt level not lower than the PV level 5.1V, 4.3V or 3.5V of the targeted programmed state 01, 00 or 10. If yes, the process is ended and if no, the step 210 is performed continuously. In the step 210, perform a program operation to program the bits of the memory not passing the PV level of the targeted programmed state by using a Vd bias BL larger than 0, such as 2V~3V Next, in step 220, check if all of the programmed bits in the step 210 pass the PV level (5.1V, 4.3V or 3.5V). If yes, the process is ended and if no, the step 230 is performed continuously. In the step 230, check if at least one of the programmed bits passes the PV level, that is, an event of at least one new bit pass (ALONBP) is triggered. If there is no ALONBP event triggered, perform the step 240 to set BL=BL+K1, wherein K1 is a fixed positive amount, such as 50 mV, and repeat the step 210 by using the new Vd bias BL. This step 240 is used to combat slower bits and save the program time.

Figure 3:
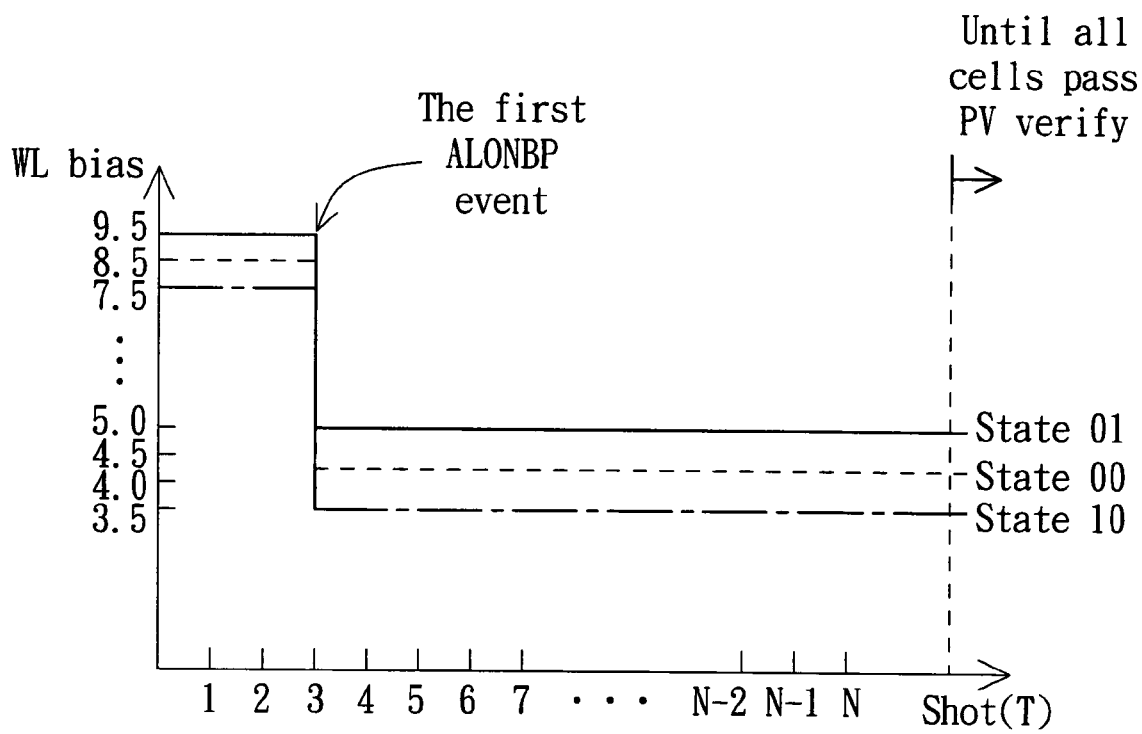
FIG. 3 is a schematic diagram of a WL bias operation according to the preferred embodiment of the invention.

Referring to FIG. 3, a schematic diagram of a WL bias operation according to the preferred embodiment of the invention is shown, such as 9.5V for the state 01, 8.5V for the state 00 and 7.5V for the state 10. From the beginning to the first ALONBP event, the word line of each programmed bit has a constant voltage drop.

Figure 4:
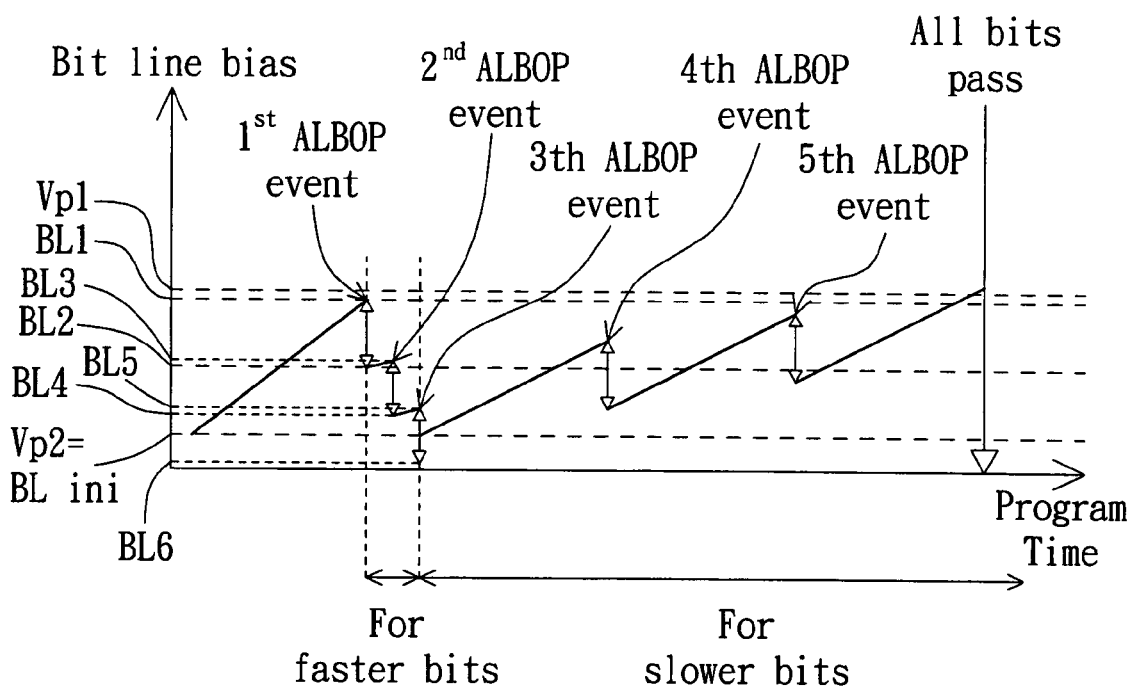
FIG. 4 is a schematic diagram of a Vd bias operation according to the preferred embodiment of the invention.

Referring to FIG. 4, a schematic diagram of a Vd bias operation according to the preferred embodiment of the invention is shown. The program operation is started by using an initial Vd bias BL (denoted by BL ini), and may be performed a number of times by adding the Vd bias BL with the fixed amount K1 each time (not shown in the figure) until the first ALBOP event is triggered. The value BL ini is chosen for the start of programming. For example, the value BL ini is 2V~3V for every programmed state 01, 00 or 10. Normally, the Vd bias BL (denoted by BL1) used when the first ALBOP event is triggered is smaller than the first preset voltage Vp1 (6V~7V).

Following that, when the ALONBP event is triggered, perform the step 250 to set BL=BL−K2, wherein K2 is a fixed positive amount, such as 50 mV, and repeat the step 210 by using the new Vd bias BL. This step 250 is to program the faster bits by a lower Vd bias BL and thus to tighten the Vt distribution. As shown in FIG. 3, after the first ALONBP event is triggered, the word line of each programmed bit has a constant voltage, such as 5.3V for the state 01, 4.5V for the state 00 and 3.5V for the state 3.5V.

As shown in FIG. 4, after the first ALONBP event is triggered, the Vd bias BL is reduced by a fixed amount K2 to a value BL2 in the step 250. When the bits of the memory not passing the PV level are programmed by using the Vd bias BL2 in the step 210, it is determined that none of the programmed bits passes the PV level in the step 230. Therefore, the Vd bias BL2 is increased by a fixed amount K1 to be a value BL3 in the step 240 and the bits not passing the PV level are programmed again in the step 210 to generate the second ALONBP event. Then, the Vd bias BL3 is reduced by the fixed amount K2 to be a value BL4 in the step 250. When the bits not passing the PV level after the second ALONBP event are programmed by using the Vd bias BL4 in the step 210, it is determined that none of the programmed bits passes the PV level in the step 230. Therefore, the Vd bias BL4 is increased by a fixed amount K1 to be a value BL5 in the step 240 to generate a third ALONBP event.

After the third ALONBP event is triggered, the Vd bias BL5 is reduced by the fixed amount K2 to a value BL6 in the step 250. However, the value BL6 is smaller than a second preset voltage Vp2, such as 2V~3V. The second preset voltage Vp2 is equal to the BL ini in the embodiment. Therefore, the bits not passing the PV level after the third ALONBP event are programmed by using the second preset voltage Vp2 as the Vd bias BL in the step 250. After the ALONBP event is triggered for a few times, such as three times in the embodiment, most of the faster bits in the memory are programmed to pass the PV level. The left slower bits are continuously programmed to pass the PV level in the following ALONBP events, such as the fourth and fifth ALONBP events until all the bits of the memory pass the PV level.

If the Vd bias BL as added by the fixed amount K1 is larger than a first preset voltage Vp1, such as 6V~7V, in the step 240, the first preset voltage Vp1 is set to be the new Vd bias BL for the next program operation. This upper limit Vp1 can prevent the left slower bits from being programmed to suddenly have a large Vt level and thus widen the program distribution due to using too large Vd bias.

By determining whether the ALONBP event is triggered or not, it can be ensured that the faster bits will be programmed to pass the PV level by using a smaller Vd bias BL and the slower bits will be programmed to pass the PV level by using a larger Vd bias BL. Therefore, the program distribution can be even more tightened and the program speed can be increased.

By a suitable program control, it can be verified that the Vt distribution of the programmed bits can be tightened to have a width about 300 mV~400 mV, and a read margin between the adjacent programmed states 01 and 00, 00 and 10, or 10 and 11 is about 400 mV~500 mV in the invention.

The method for programming a MLC memory disclosed by the above embodiment of the invention has the following advantages:

1. Compared to the prior-art method, the slower bits of the memory are programmed by using a larger Vd bias. Therefore, the programming speed of the program operation in the invention can be improved.

2. Owing that the faster bits of the memory are programmed by using a smaller Vd bias. Therefore, the Vt distribution of programmed bits can be further tightened to give a larger read margin, and thus the bit error rate of the read operation can be greatly reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a multi-level cell (MLC) memory, the MLC memory comprising a plurality of bits, each bit having a plurality of programmed states, each programmed state having a program verify (PV) level, the method comprising:
   (a) programming the bits of the memory having a threshold voltage (Vt) level lower than the PV level of a targeted programmed state into programmed bits by using a bit-line voltage BL, wherein BL is larger than 0;
   (b) ending this method if each bit of the memory has a Vt level not lower than the PV level of the targeted programmed state, otherwise, continuing the step (c); and
   (c) setting BL=BL+K1, K1 being a fixed positive amount, and repeating the step (a) if each of the programmed bits has a Vt level lower than the PV level, while setting BL=BL−K2, K2 being a fixed positive amount, and repeating the step (a) if at least one of the programmed bits has a Vt level not lower than the PV level.

2. The method according to claim 1, wherein the MLC memory is a charge localized trapped memory with oxide-nitride-oxide (ONO) structure.

3. The method according to claim 1, wherein the MLC memory is a flash memory.

4. The method according to claim 1, wherein each bit has four programmed states 11, 10, 00 and 01.

5. The method according to claim 1, wherein the fixed positive amount K1 is 50 mV.

6. The method according to claim 1, wherein the fixed positive amount K2 is 50 mV.

7. The method according to claim 1, wherein a word line of each programmed bit has a constant voltage drop from the beginning of an event of at least one new bit pass (ALONBP) is first triggered.

8. The method according to claim 7, wherein the word-line bias of each programmed bit is 9.5V for the targeted programmed state 01, 8.5V for the targeted programmed state 00, and 7.5V for the targeted programmed state 10 before the first time when at least one of the programmed bits in the step (a) has a Vt level not lower than the PV level of the targeted programmed state.

9. The method according to claim 7, wherein the word line of each programmed bit has a constant voltage after the first time when at least one of the programmed bits in the step (a) has a Vt level not lower than the PV level of the targeted programmed state.

10. The method according to claim 7, wherein an initial bit-line bias of each programmed bit is chosen for the start of programming.

11. The method according to claim 10, wherein the initial bit-line bias of each programmed bit is 2V~3V for every targeted programmed state in the step (a).

12. The method according to claim 1, wherein the step (c) further comprising:

if the bit-line voltage BL is larger than a first preset voltage, setting the first preset voltage to be the bit-line voltage BL.

13. The method according to claim 12, wherein the first preset voltage is 6V~7V.

14. The method according to claim 1, wherein the step (d) further comprising:

if the bit-line voltage BL is smaller than a second preset voltage, setting the second preset voltage to be the bit-line voltage BL.

15. The method according to claim 14, wherein the second preset voltage is 2V~3V.

16. The method according to claim 1, wherein a Vt distribution width of each programmed state is about 300 mV~400 mV.

17. The method according to claim 1, wherein a read margin between the adjacent programmed states is about 400 mV~500 mV.

18. The method according to claim 1, wherein before the step (a), the method further comprises determining if every bit of the memory has a Vt level not lower than the PV level of the targeted programmed state, if yes, stopping the method and if no, continuing the step (a).

* * * * *